United States Patent [19]
Marek

[11] 3,806,823
[45] Apr. 23, 1974

[54] DIFFERENTIAL AMPLIFIER

[75] Inventor: Alois Marek, Nussbaumen, Switzerland

[73] Assignee: BBC Brown Boveri & Company Limited, Baden, Switzerland

[22] Filed: July 23, 1971

[21] Appl. No.: 165,574

[30] Foreign Application Priority Data

Aug. 4, 1970 Switzerland ........................ 11699/70

[52] U.S. Cl. ..................... 330/30 D, 330/22, 330/69
[51] Int. Cl. ............................................ H03f 3/68
[58] Field of Search ............ 330/30 D, 30 R, 69, 22

[56] References Cited

UNITED STATES PATENTS 3,466,562 9/1969 Sramek ............................ 330/30 D
3,628,059 12/1971 Niu .............................. 330/30 D X
3,153,203 10/1964 Sem-Jacobsen et al. ......... 330/30 D

*Primary Examiner*—Herman Karl Saalbach
*Assistant Examiner*—Lawrence J. Dahl
*Attorney, Agent, or Firm*—W. G. Fasse

[57] ABSTRACT

The present differential amplifier comprises two amplifier stages, preferably transistor stages, coupled to each other through a two terminal coupling network having a non-linear and point- or radial-symmetrical characteristic whereby the non-linearity in the input voltage output current characteristic of the amplifier stages is compensated by a corresponding non-linearity of the two terminal coupling network so that the characteristic of the differential amplifier is linearized over a wide range.

12 Claims, 7 Drawing Figures

INVENTOR.
ALOIS MAREK
BY
[signature]
ATTORNEY

INVENTOR.
ALOIS MAREK
BY G. G. Gasse
ATTORNEY

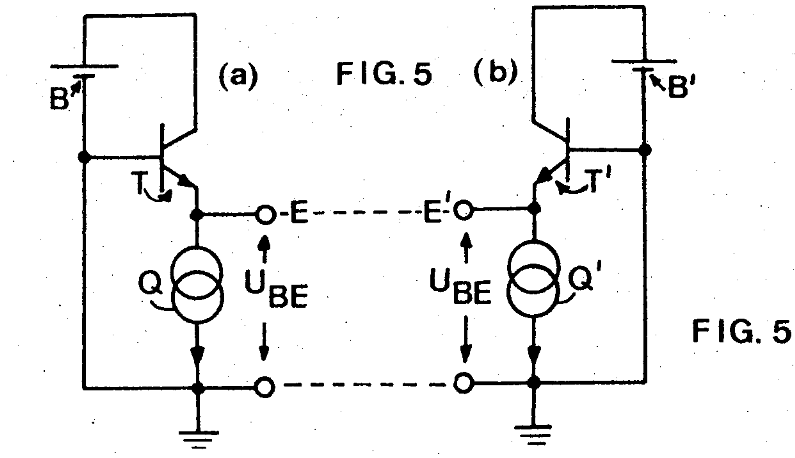
FIG. 5
FIG. 5
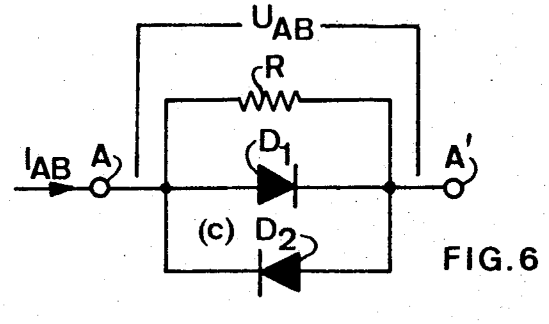
FIG. 6
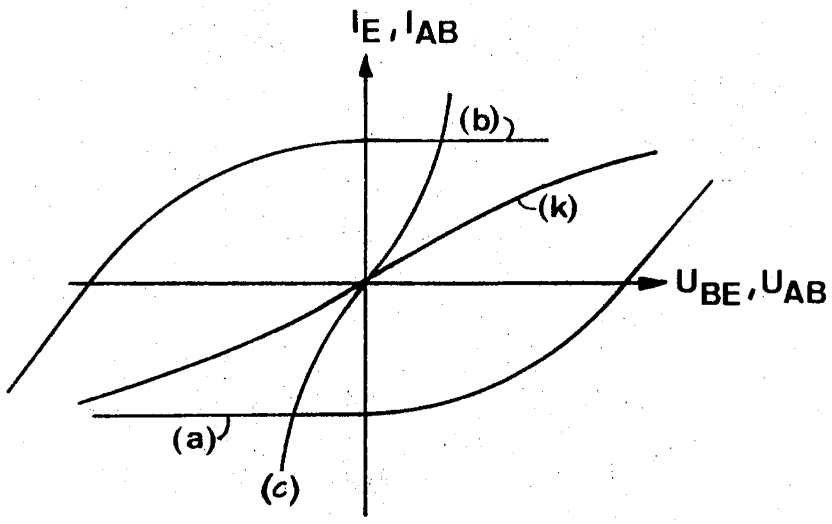
FIG. 7
INVENTOR.
ALOIS MAREK
BY G. G. Gasse
ATTORNEY

DIFFERENTIAL AMPLIFIER

BACKGROUND OF THE INVENTION:

The present invention relates to differential amplifiers comprising two amplifier stages coupled to each other by a common coupling two terminal network and differentially controlled by a working signal. The amplified working or output signal is available across two terminal load means provided for the amplifier stages.

The imput-output characteristic, more specifically, the input voltage output current characteristic of conventional differential amplifiers is usually linear only in a relatively small range of said input voltage output current characteristic. However, in many applications, especially in connection with testing amplifiers, it is necessary to have a linear dependency between the input voltage and the output current over a range as large as possible in said input voltage output current characteristic. One known approach to improving the linearity is, for example, to increase the common emitter resistance in such amplifiers. However, the drawback of this approach is a reduced transconductance of the amplifier circuit arrangement. Even the by now classic negative feedback is usually not suitable for achieving a linearization because the negative feedback reduces the band width and it may even cause instabilities of the circuit arrangement.

OBJECTS OF THE INVENTION:

In view of the foregoing, it is the aim of the invention to achieve the following objects singly or in combination:

- to provide an electronic circuit arrangement for a differential amplifier which overcomes the outlined drawbacks;
- to achieve in connection with differential amplifiers a linearization of the input voltage output current characteristic whereby the means necessary for this purpose may not cause any substantial loss in the transconductivity of the amplifier;
- to provide a differential amplifier, the amplification or gain of which is independent of frequency over a wide frequency range;
- to provide an improved differential amplifier having an input voltage output current characteristic which is substantially linear or rather as linear as possible;
- to provide a differential amplifier, the electrical characteristics of which, for example the d.c. voltage drift, the push-push suppression and so forth are not influenced in a disadvantageous manner by the means necessary for the desired linearization.

SUMMARY OF THE INVENTION:

The above objects have been achieved according to the invention in differential amplifier circuits in which two amplifying stages are coupled to each other by means of a two terminal network having a non-linear, point- or radial-symmetric characteristic. Preferably, the two terminal coupling network comprises two diodes connected in anti-parallel fashion relative to each other and in parallel to an ohmic resistance whereby said non-linear radial-symmetric characteristic is obtained which compensated for the non-linearity of the amplifier stages.

BRIEF DESCRIPTION OF THE DRAWINGS:

In order that the invention may be clearly understood, it will now be described, by way of example, with reference to the accompanying drawings, wherein:

FIGS. 5 and 6 are simplified circuit diagrams intended to illustrate the operation of the differential amplifier according to the invention with reference to FIG. 7 which illustrates the linearising effect achieved by this invention.

Figure 1:
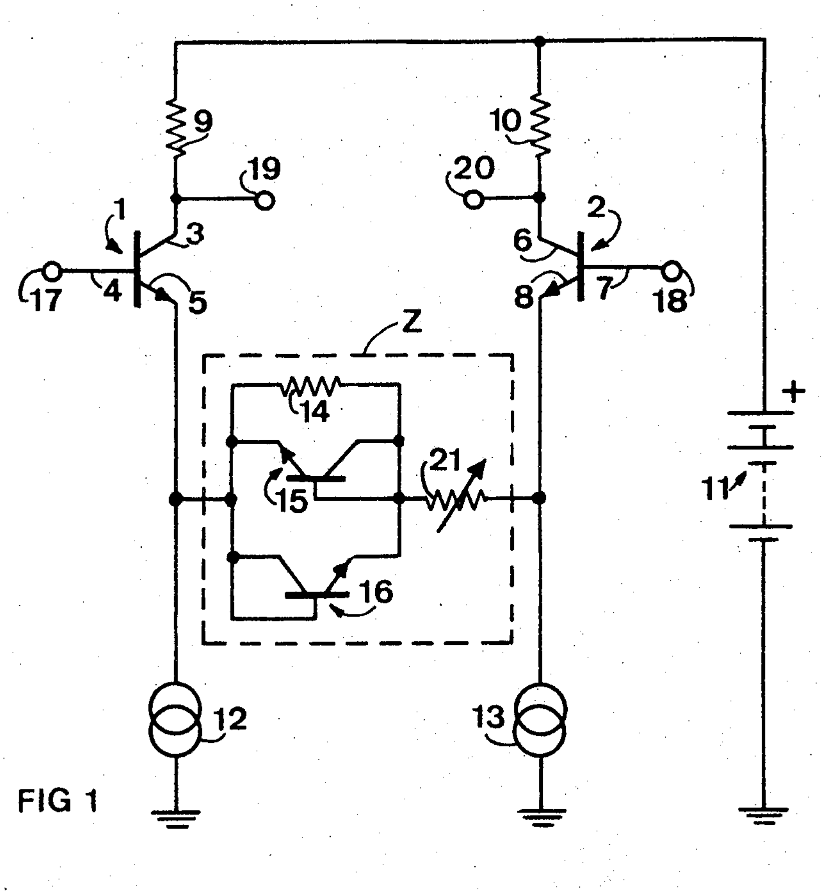
FIG. 1 illustrates a circuit diagram of the differential amplifier embodying the invention and employing two transistor amplifier stages operating in the so called emitter configurations.

DETAILED DESCRIPTION OF EXAMPLE EMBODIMENTS:

FIG. 1 illustrates a differential amplifier comprising two stages each having an npn-transistor 1 and 2. The collector electrode 3 of the transistor 1 is connected to two terminal load means such as a resistor 9 and to an output terminal 19. The base electrode 4 of the transistor 1 is connected to an input terminal 17. The emitter electrode 5 of the transistor 1 is connected through constant current means 12 to ground. The transistor 2 is connected with its collector electrode 6 to a further output terminal 20 and also to a further two terminal load means such as a resistor 10. The base electrode 7 of the transistor 2 is connected to a second input terminal 18. The input working signal is supplied to the input terminals 17 and 18. The emitter electrode 8 of the transistor 2 is connected through further constant current means 13 to ground. The load resistors 9 and 10 connect their respective collector electrodes 3 and 6 to the positive terminal of a power supply battery 11. The negative terminal of the battery 11 is connected to ground.

According to the invention there is provided a two terminal coupling network Z which is connected with its terminals to the emitter electrodes 5 and 8. This two terminal coupling network Z comprises a parallel circuit including an ohmic resistor 14 and two diodes 15 and 16 connected in anti-parallel fashion relative to each other. Further, the network Z comprises an adjustable resistor 21 which is connected in series with the just described parallel circuit. It has been found to be advantageous if the two diodes 15 and 16 are made of the same semi-conductor material as the transistors 1 and 2. It has further been found to be advantageous to embody the two diodes by means of transistors thereby employing their base-emitter-path while short-circuiting their base-collector-path. This is shown, for example, in FIG. 1. Moreover, it is advantageous to employ for the diodes 15 and 16 the same transistor types as are employed for the amplifier transistors 1 and 2.

As mentioned, the working or input voltage is supplied to the input terminals 17 and 18 connected to the respective base electrodes 4 and 7 of the differential amplifier transistors 1 and 2. The amplified working or output signal is available at the output terminals 19 and 20 connected to the respective collector electrodes 3 and 6 whereby the differential amplifier is operated in the so called emitter configuration.

Figure 2:
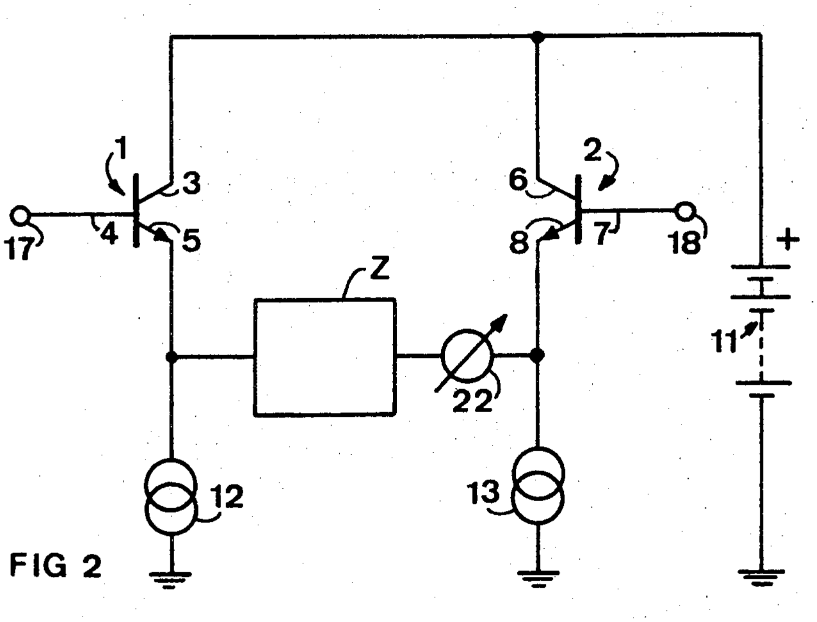
FIG. 2 illustrates the circuit diagram of a differential amplifier arranged in the so called collector configuration and operating as a direct voltage testing or measuring amplifier.

The circuit diagram of FIG. 2 illustrates the use of a differential amplifier according to FIG. 1 as a testing or measuring amplifier. The same elements are designated by the same reference numerals as in FIG. 1. However, the amplifier according to FIG. 2 operates in the so called collector configuration since the load resistors 9 and 10 in the collector leads are omitted in FIG. 2. The load in the arrangement according to FIG. 2 is represented by a direct current instrument 22 which receives the amplified output signal in the form of the load current. The direct current instrument is connected in series with the two terminal coupling network Z which comprises the same element as described with reference to FIG. 1, namely a parallel connection of an ohmic resistor and two diodes connected in anti-parallel fashion relative to each other and in parallel to the ohmic resistor which parallel circuit is in turn connected in series to the adjustable resistor such as shown at 21 in FIG. 1. In the embodiment of FIG. 2 such adjustable resistor may be employed for calibrating the instrument 22 whereas in FIG. 1 it is employed to adjust the amplification or gain.

Figure 3:
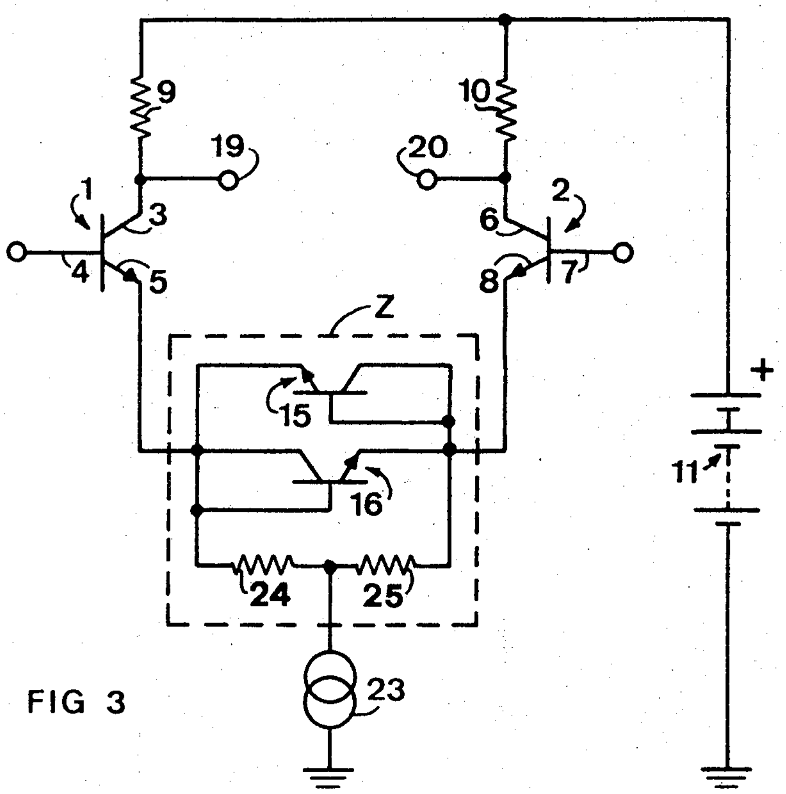
FIG. 3 is the circuit diagram of a modification of the differential amplifier of FIG. 1.

Another embodiment of the invention is shown in FIG. 3 in which also the same elements are designated by the same reference numerals. The circuit arrangement according to FIG. 3 differs from that of FIG. 1 in that only one constant current source 23 is provided and the resistor 14 of FIG. 1 has been replaced by a series circuit of two ohmic resistors 24 and 25 of equal size. The constant current source 23 which now must deliver twice as much current as each of the constant current sources 12 and 13 of FIG. 1, is connected to the junction between the series connected resistors 24 and 25 and the series connection of these resistors is, as in FIG. 1, connected in parallel to the diodes 15 and 16.

The differential amplifiers shown in FIGS. 1 and 3 have the advantage that their amplification is linear over a wide control or regulating range. Thus, it is possible to achieve a linearity of 0.1 percent in a range of 0 — 50 percent $I_{Amax}$ (maximum output current) if the respective circuit arrangements comprise the following elements. For a control or regulating range up to 75 percent of $I_{Amax}$ the linearity is even under this more extenuating circumstance better than 0.5 percent.

Dimensioning examples for the circuit arrangement according to FIG. 1

| | |
|---|---|
| Transistors **1,2**: BCY 56 or 2N3904 | ASY 75 |
| Resistors **9, 10**: 10 K | 5 K |
| Resistor **14**: 300 | 130 |
| Resistor **21**: 0 . . . 500 | 0 . . . 300 |
| Diodes **15** and **16**: Si-Types, inverse current 0.7μA | Ge-Types inverse current 9μA |
| Operating voltage: 14 Volts | 14 Volts |
| Operating current: 2×0.5mA | 2×1 mA |

Figure 4:
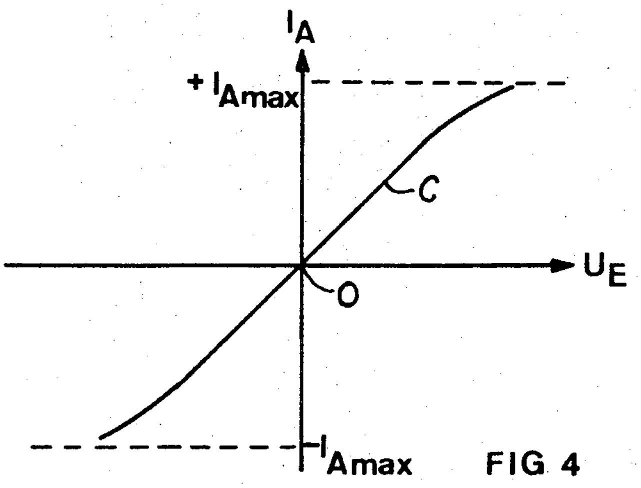
FIG. 4 illustrates the output current as a function of the input voltage of a differential amplifier as illustrated in FIG. 1.

The improved input voltage output current characteristic C of a differential amplifier constructed and arranged in accordance with the above given examples for the elements, is shown for instance in FIG. 4. The good linearity of the improved characteristic C is achieved by the fact that the non-linearity of the amplifier stages or rather of the transistors representing these stages is compensated by a respective or corresponding non-linearity of the two terminal coupling network Z. Since a differential amplifier has a point- or radial-symmetric characteristic relative to the origin or center of the coordinate system in which the characteristic or characteristics are represented, it is necessary that the compensating two terminal coupling network also has a point- or radial-symmetric characteristic. The cooperation of the amplifier stages and the two terminal coupling network Z will now be described in more detail with reference to FIGS. 5, 6, and 7.

In FIG. 5, the two transistor amplifier stages are designated by reference numerals (a) and (b). Each stage comprises a respective transistor T or T′ in the collector circuit of which there is arranged a battery B or B′. The emitter circuits of the amplifier stages are connected to respective constant current sources Q or Q′. The base electrodes of the transistors are respectively connected to ground. Moreover, the emitter electrodes are connected to terminals E and E′. Across the constant current sources that is between the terminals E, E′ and ground a voltage $U_{BE}$ is available.

FIG. 6 illustrates the two terminal coupling network having the non-linear, point-symmetric characteristic as taught by the present invention. This coupling network is designated by the reference character (c). The two terminal coupling network (c) comprises a parallel connection of an ohmic resistor R and two diodes D1 and D2 connected in anti-parallel fashion relative to each other and in parallel to the resistor R. The terminals are designated by A and A′, the output voltage $U_{AB}$ is available across these terminals and the output current $I_{AB}$ is shown to flow into terminal A.

FIG. 7 illustrates the characteristic curves of the circuit arrangements shown in FIGS. 5 and 6. The amplifier stage (a) of FIG. 5 has the characteristic (a), the amplifier stage (b) has the characteristic (b) and the two terminal network of FIG. 6 has the characteristic (c). FIG. 7 further illustrates the characteristic curve (k) representing the combined characteristic of the differential amplifier of FIG. 5 if its stages are interconnected as indicated by the dashed lines in FIG. 5, that is, if the terminal E is connected to terminal E′. It may be assumed that the characteristic (k) is obtained by addition of the characteristic curves (a) and (b) thereby proceeding in the direction of the voltage $U_{BE}$, that is, in the direction of the abscissa. In other words, the characteristic curve (k) results from a series connection of the amplifier stages (a) and (b) of FIG. 5. The characteristic curve (k) represents the normal characteristic of a differential amplifier. It will be noted that its linear range is rather narrow above and below the origin O of the coordinate system.

If now the two terminal parallel circuit network of FIG. 6 is inserted into the series connection of the amplifier stages (a) and (b) of FIG. 5, that is, if the terminal E is connected to terminal A and if terminal E′ is connected to terminal A′, one obtains a differential amplifier with a common two terminal coupling network having a non-linear, point- or radial-symmetric characteristic as represented by curve (c). The characteristic curve of such an arrangement results, as indicated above, by the addition of the characteristic (k) of the differential amplifier and the characteristic (c) of the two terminal coupling network again proceeding in the direction of the abscissa, that is, in the voltage direction. The resulting corrected or compensated characteristic C is shown for clarity's sake in FIG. 4 rather than in FIG. 7.

In view of the above it will be appreciated that the characteristic of a conventional differential amplifier can be linearized in a surprisingly simple manner by a suitable characteristic of a two terminal coupling network as taught by the present invention. Since differential amplifiers generally have a point-symmetric characteristic relative to the origin of the input voltage output current characteristic coordinate system, it is necessary that the characteristic of the two terminal coupling network also has a point-symmetric characteristic in order to realize an optimum linearization.

Although the invention has been described with reference to specific example embodiments, it is to be understood that it is intended to cover all modifications and equivalents within the scope of the appended claims.

What I claim is:

1. A differential amplifier circuit arrangement, comprising a first amplifier stage, a second amplifier stage, each amplifier stage having a control input as well as first and second main terminals, load resistor means connected to the first main terminal of each amplifier stage, current source means connected to the second main terminal of each amplifier stage, and two terminal coupling circuit means operatively connected between said second main terminal of said amplifier stage, said two terminal coupling circuit means having a nonlinear current voltage characteristic which has radial symmetry about the origin of a coordinate system in which said current voltage characteristic curve is shown, whereby a linearization of the amplification is achieved over a wide range of input voltages, said two terminal coupling network for said first and second amplifier stages comprising a parallel circuit including an ohmic resistance and two diodes, said diodes being connected in anti-parallel fashion relative to each other and in parallel to said ohmic resistance, said amplifier stages each comprising a transistor with the respective collector-, base-, and emitter-electrodes, means for connecting the collector electrodes to said load means and to said output means whereby the amplified output signal is available at said output means, means for d.c. connecting said parallel circuit between the emitter electrodes of said transistor, and means for connecting said input means to the respective base electrodes of said transistors.

2. The differential amplifier according to claim 1, wherein said two terminal coupling network further comprises an adjustable ohmic resistance connected in series between said parallel circuit and one of said emitter electrodes whereby the transconductance of the differential amplifier is adjustable.

3. The differential amplifier according to claim 1, wherein said diodes are made of the same semiconductor material as the transistors of said amplifier stages.

4. The differential amplifier according to claim 1, comprising two further transistors for representing said diodes, each transistor having the respective collector-, base-, and emitter electrodes, means connected across the base-collector-path for short-circuiting said base collector path of each transistor, said diodes being formed by the emitter-base-path of each transistor.

5. The differential amplifier according to claim 4, wherein said further transistors forming said diodes have the same electrical characteristic data as the transistors forming said amplifier stages.

6. A differential amplifier circuit arrangement, comprising a first amplifier stage, a second amplifier stage, each amplifier stage having a control input as well as first and second main terminals, load resistor means connected to the first main terminal of each amplifier stage, current source means connected to the second main terminal of each amplifier stage, and two terminal coupling circuit means operatively connected between said second main terminals of said amplifier stages, said two terminal coupling circuit means having a nonlinear current voltage characteristic which has radial symmetry about the origin of a coordinate system in which said current voltage characteristic curve is shown, whereby a linearization of the amplification is achieved over a wide range of input voltages, said two terminal coupling network for said first and second amplifier stages comprising a parallel circuit including an ohmic resistance and two diodes, said diodes being connected in anti-parallel fashion relative to each other and in parallel to said ohmic resistance, and an adjustable ohmic resistance connected in series with said parallel circuit, said two terminal load means being connected in series between said two terminal coupling network and one of said amplifier stages whereby the amplified output signal is available across said two terminal load means.

7. The differential amplifier according to claim 6, wherein said two terminal load means comprise a d.c. measuring instrument connected in series between said two terminal coupling network and one of said amplifier stages.

8. The differential amplifier according to claim 6, wherein each of said amplifier stages comprises a transistor with the respective collector-, base-, and emitter-electrodes, means for connecting said two terminal load means in series between one of said emitter electrodes and said two terminal coupling network, power supply means, means for interconnecting said power supply means and said collector electrodes, and constant current means connected between ground and each of said emitter electrodes.

9. A differential amplifier circuit arrangement comprising a first amplifier stage, a second amplifier stage, each amplifier stage having a control input as well as first and second main terminals, load resistor means connected to the first main terminal of each amplifier stage, current source means connected to the second main terminal of each amplifier stage, and two terminal coupling network means operatively connected between said second main terminals of said amplifier stages, said two terminal coupling circuit means having a non-linear current voltage characteristic which provides the same d.c. current voltage relationship for either direction of current flow therethrough, whereby a linearization of the amplification is achieved over a wide range of input voltages.

10. The differential amplifier according to claim 13, wherein each of said first and second amplifier stages comprises a transistor having the respective collector-, base-, and emitter-electrodes, power supply means, said two terminal load means including two resistors connected between said collector electrodes and the power supply means, constant current means connected between ground and each of said emitter electrodes, and means for connecting said two terminal coupling network between said emitter electrodes, said output means being connected to said collector electrodes.

11. The differential amplifier according to claim 13, wherein each of said first and second amplifier stages comprises a transistor having the respective collector-, base-, and emitter-electrodes, power supply means, said two terminal coupling network comprising a parallel circuit including two diodes connected in anti-parallel fashion relative to each other and a series connection of two resistors including a junction between the resistors which are connected in parallel to said diodes, constant current means, and means for connecting the constant current means between ground and said junction.

12. The differential amplifier according to claim 11, wherein said two terminal load means is connected between said collector-electrodes and said power supply means, said output means being connected to said collector-electrodes, said two terminal coupling network being connected between said emitter-electrodes.

* * * * *

UNITED STATES PATENT OFFICE

CERTIFICATE OF CORRECTION

Patent No. 3,806,823 Dated April 23, 1974

Inventor(s) Alois Marek

It is certified that error appears in the above-identified patent and that said Letters Patent are hereby corrected as shown below:

Column 6, line 59 "13" should be --9--

Column 7, line 4 "13" should be --9--

Signed and sealed this 10th day of September 1974.

(SEAL)
Attest:

McCOY M. GIBSON, JR.
Attesting Officer

C. MARSHALL DANN
Commissioner of Patents